United States Patent
Hollmann et al.

(10) Patent No.: US 9,710,574 B2
(45) Date of Patent: Jul. 18, 2017

(54) SYSTEM AND METHOD FOR GENERATING THREE-DIMENSIONAL MODELS IN A PRODUCT MANAGEMENT APPLICATION

(71) Applicant: General Electric Company, Schenectady, NY (US)

(72) Inventors: Frank Hollmann, Osnabrueck (DE); Stefan Pieper, Emsbueren (DE)

(73) Assignee: General Electric Company, Schenectady, NY (US)

(*) Notice: Subject to any disclaimer, the term of this patent is extended or adjusted under 35 U.S.C. 154(b) by 273 days.

(21) Appl. No.: 14/324,319

(22) Filed: Jul. 7, 2014

(65) Prior Publication Data

US 2016/0004791 A1 Jan. 7, 2016

(51) Int. Cl.
*G06F 17/50* (2006.01)
*G05B 19/418* (2006.01)

(52) U.S. Cl.
CPC ....... *G06F 17/50* (2013.01); *G05B 19/41805* (2013.01); *G05B 19/41885* (2013.01); *G05B 2219/35155* (2013.01)

(58) Field of Classification Search
None
See application file for complete search history.

(56) References Cited

U.S. PATENT DOCUMENTS

| 4,847,761 A | 7/1989 | Ferriter et al. |
| 5,119,307 A | 6/1992 | Blaha et al. |
| 2011/0251975 A1* | 10/2011 | Evans ............... G06F 17/50 705/348 |
| 2013/0006408 A1 | 1/2013 | Zakrzwski et al. |
| 2013/0191461 A1* | 7/2013 | Batra ............... G06F 17/50 709/206 |

* cited by examiner

*Primary Examiner* — Edward Martello
(74) *Attorney, Agent, or Firm* — Dority & Manning, P.A.

(57) ABSTRACT

The present disclosure is directed to a system and method for generating a three-dimensional (3D) assembly on-demand in a product management system, such as a product lifecycle management (PLM) system. The method includes electronically creating and storing one or more instance objects in the product management system. Another step includes electronically mapping the one or more instance objects to function information in the product management system. The method also includes electronically receiving, via a network portal, user input regarding a selection of one or more functions representing product information from the product management system. Still another step includes electronically generating the 3D assembly based on one or more of the mapped instance objects and the user input.

16 Claims, 10 Drawing Sheets

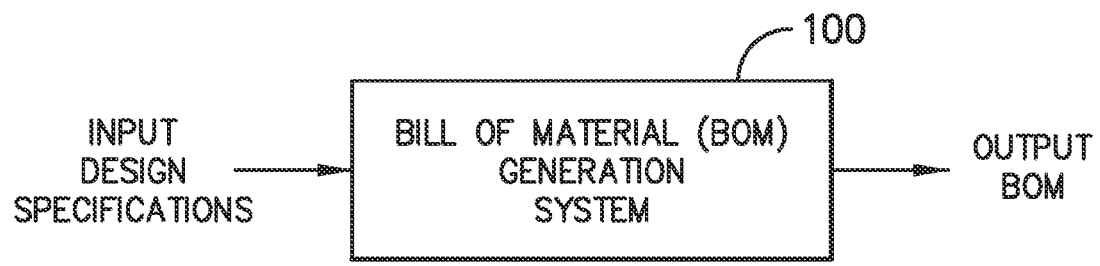
FIG. -1-
(PRIOR ART)
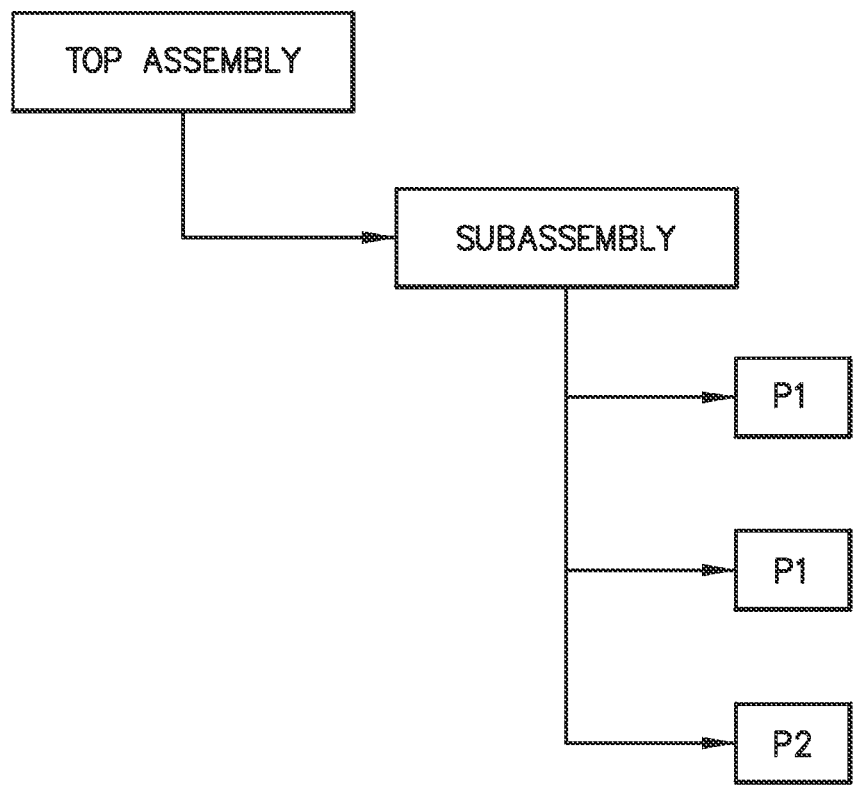
FIG. -2-
(PRIOR ART)

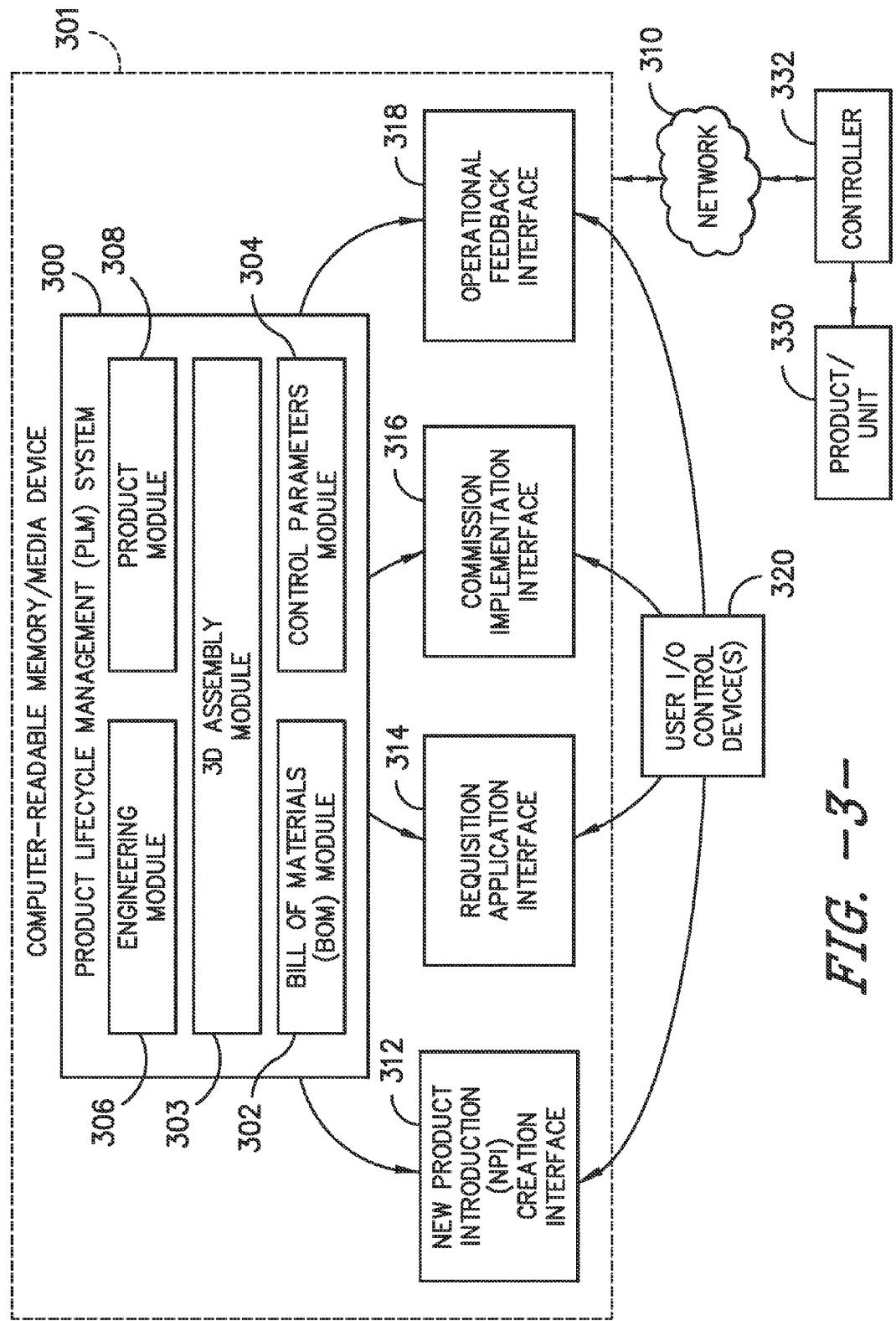
FIG. -3-

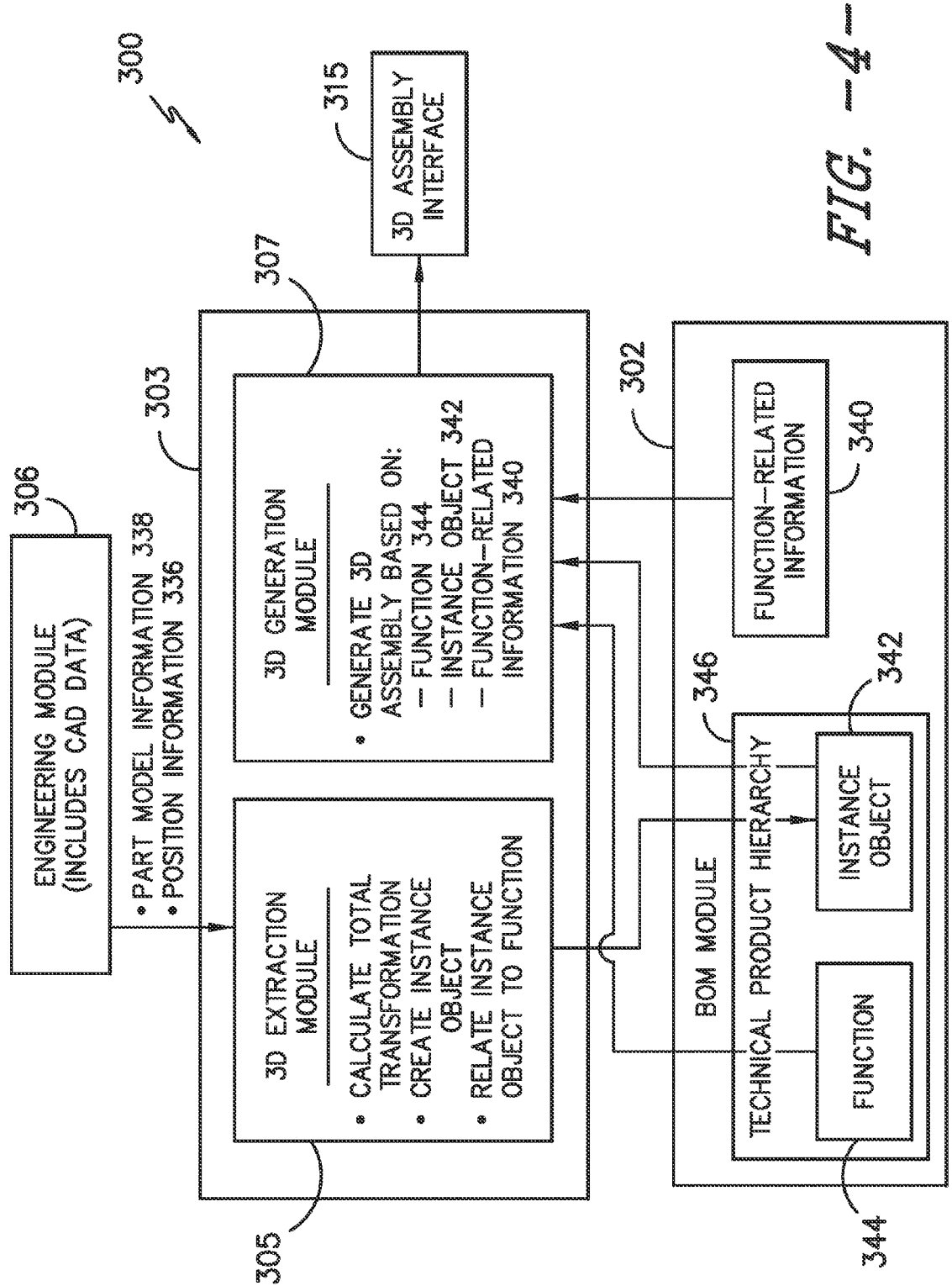

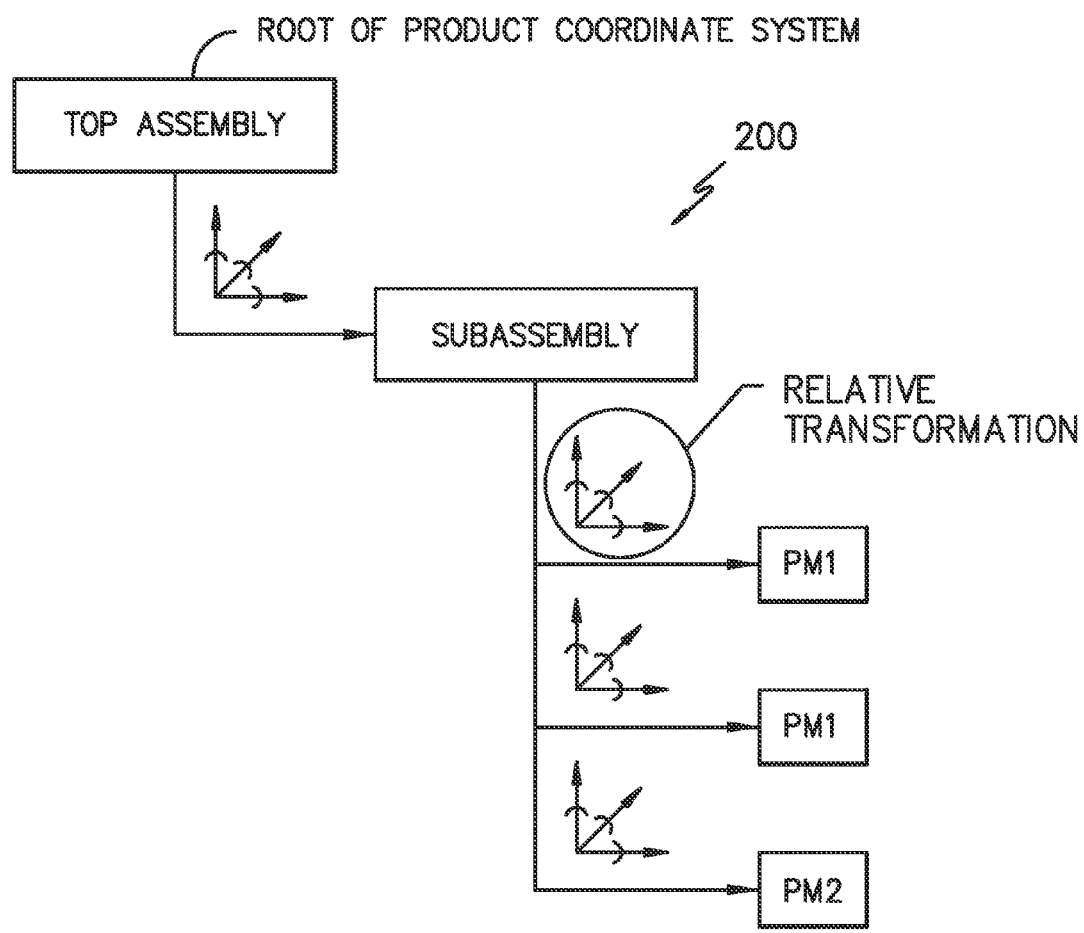
FIG. -5-

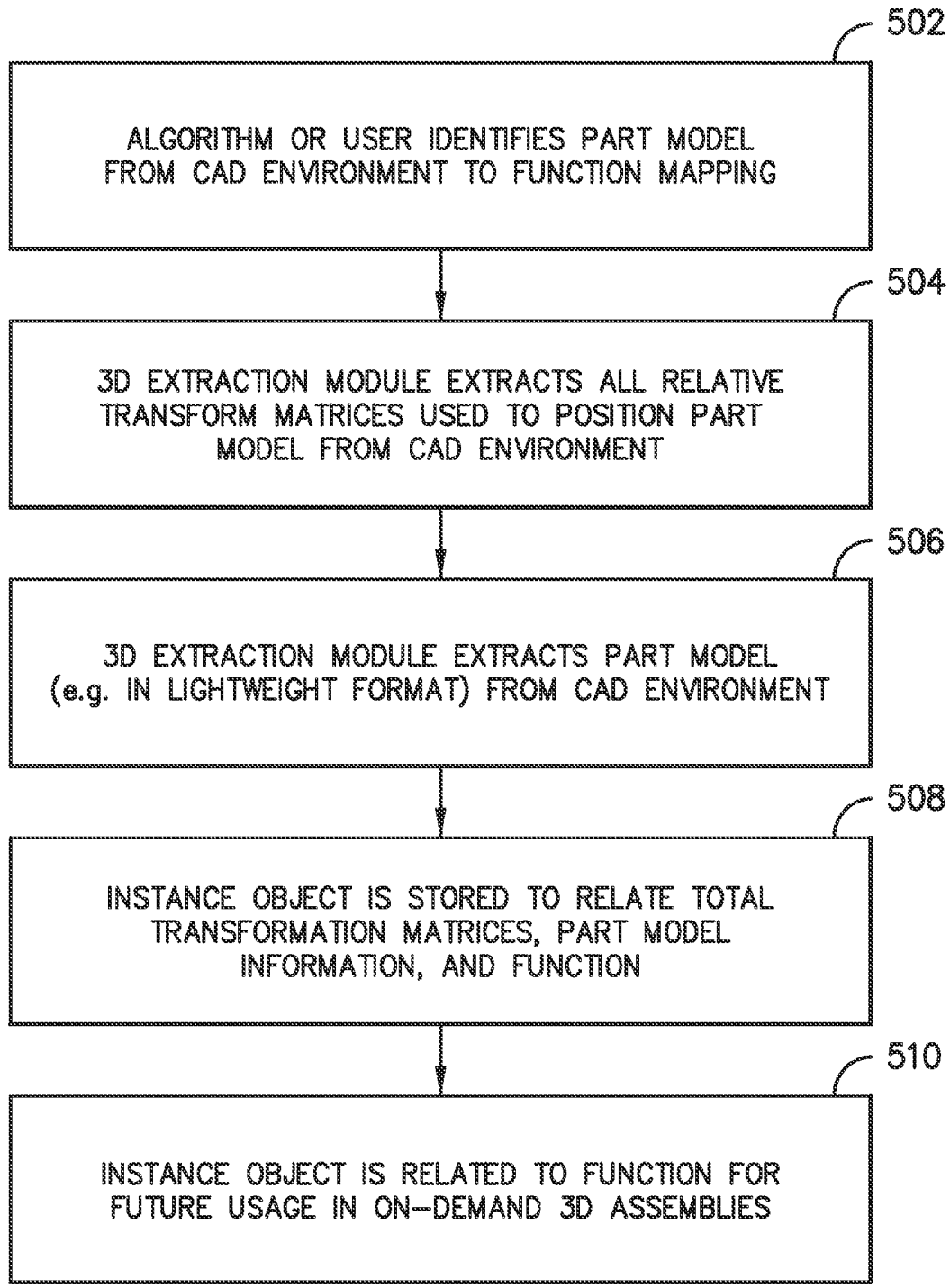
FIG. -6-

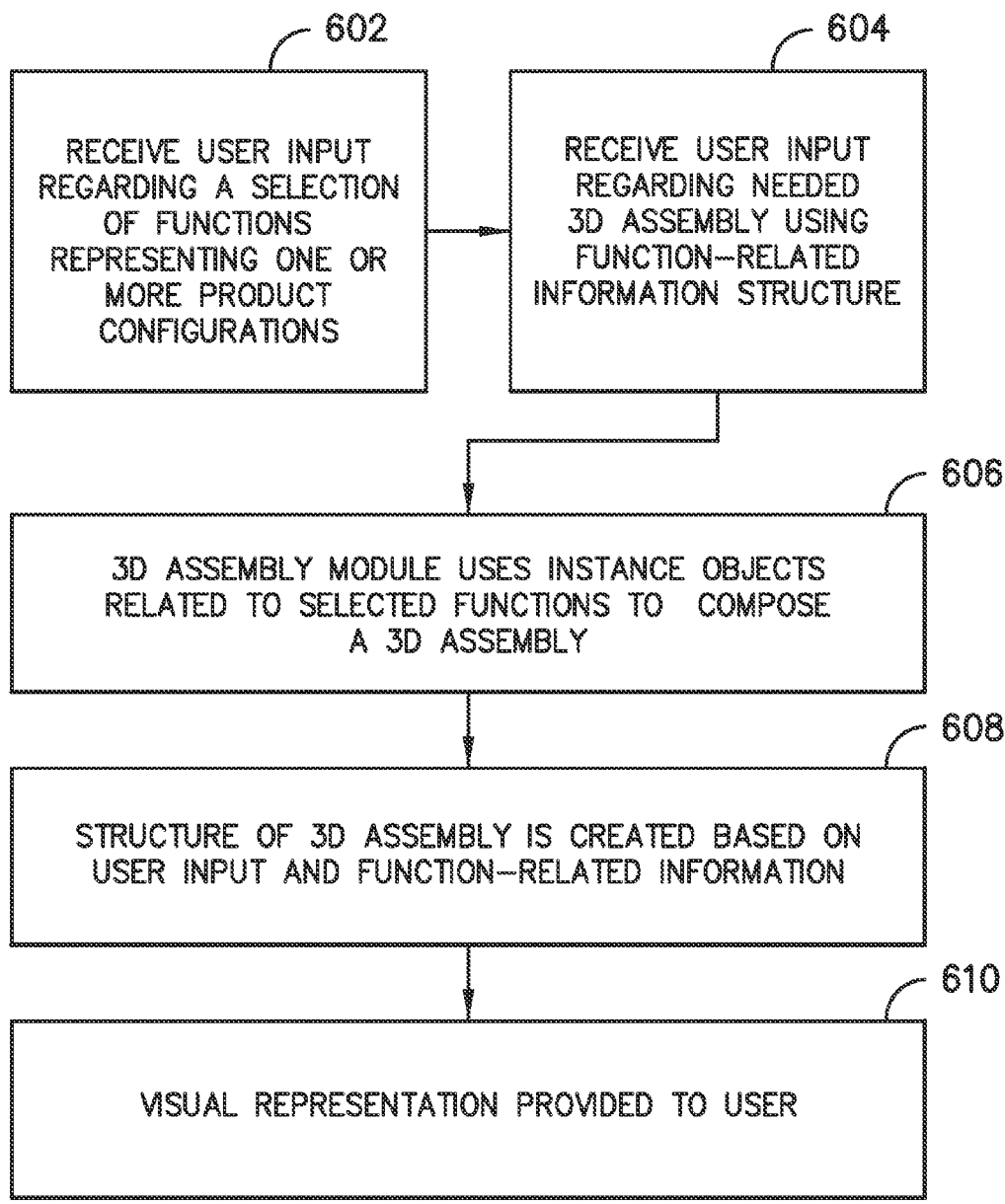
FIG. -7-

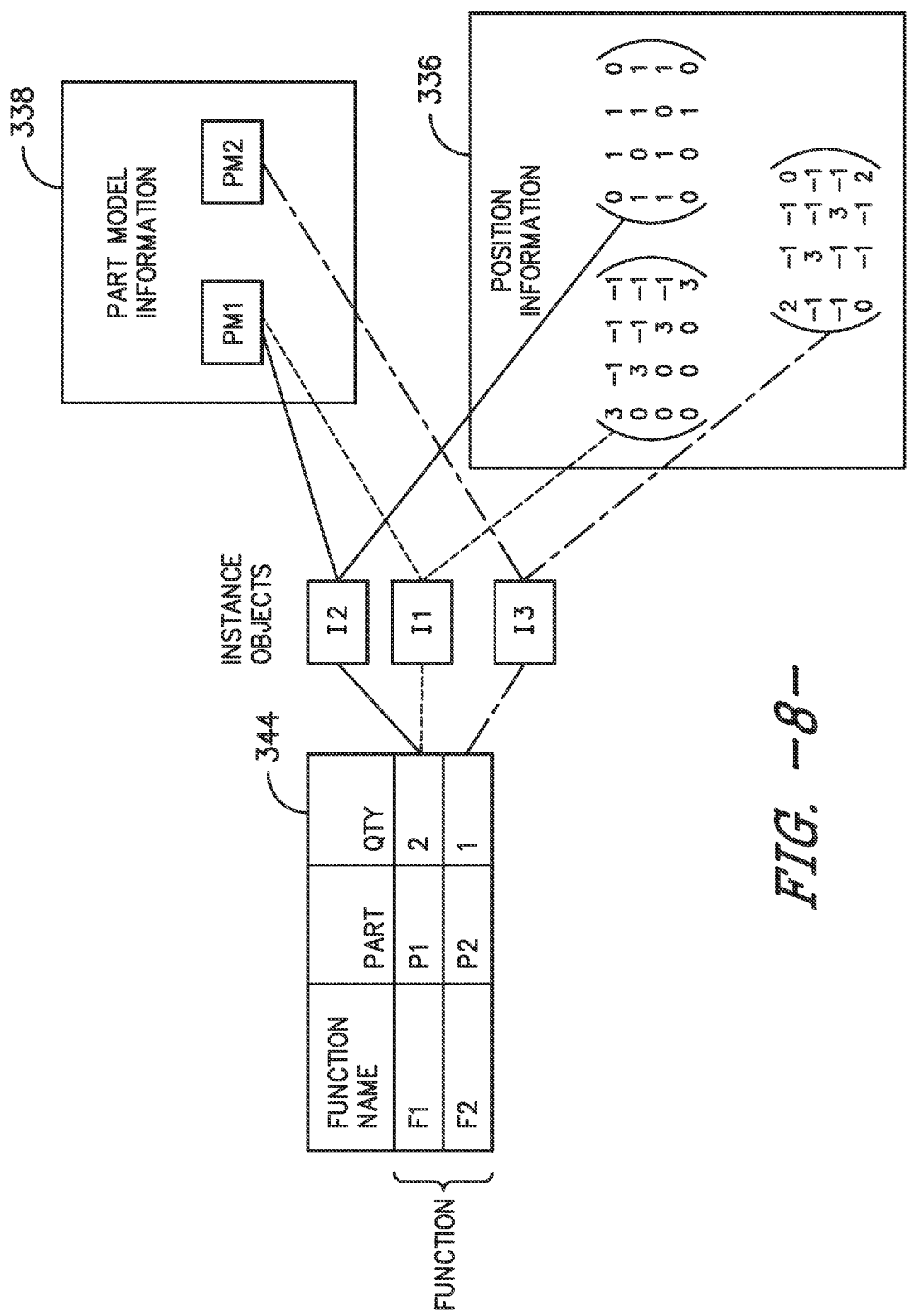
FIG. -8-

① | FUNCTION | PART | QTY |
|---|---|---|
| F1 | P1 | 2 |
| F2 | P2 | 1 |
= 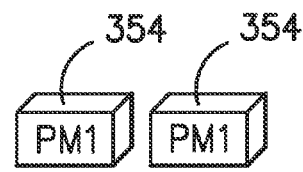
*FIG. -9-*
② | FUNCTION | PART | QTY |
|---|---|---|
| F1 | P1 | 2 |
| F2 | P2 | 1 |
= 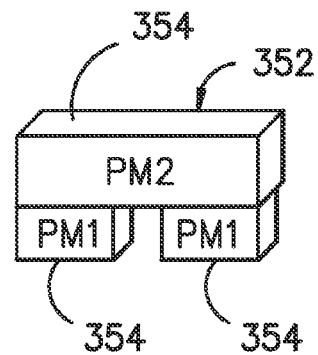
*FIG. -10-*

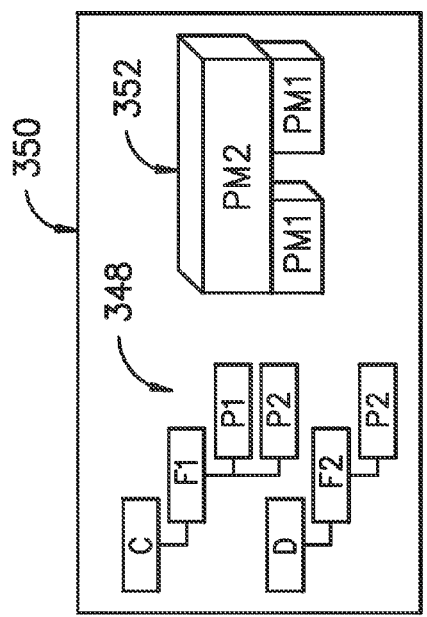
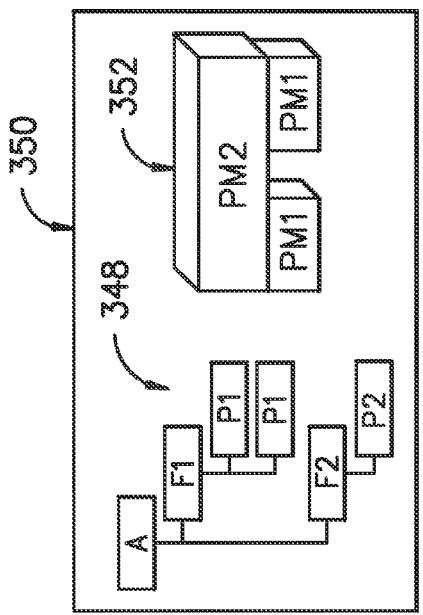
FIG. -11-
FIG. -12-

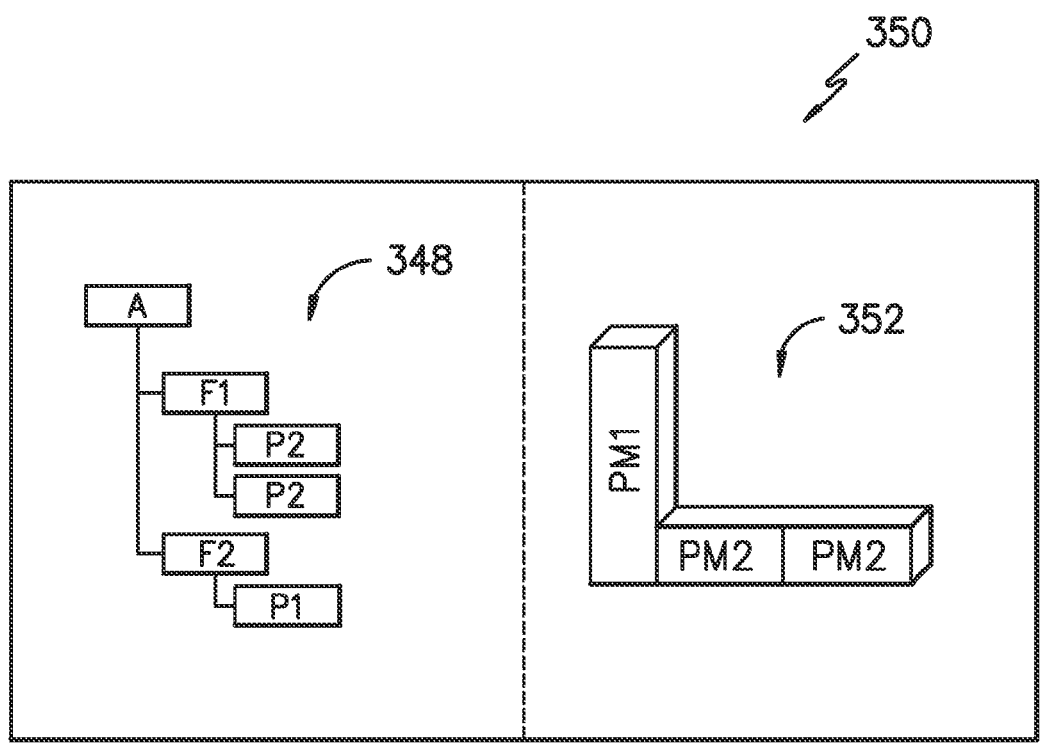
FIG. -13-

SYSTEM AND METHOD FOR GENERATING THREE-DIMENSIONAL MODELS IN A PRODUCT MANAGEMENT APPLICATION

FIELD OF THE INVENTION

The subject matter disclosed herein generally relates to automated systems and methods for creating and managing a comprehensive electronic representation and implementation of a product. More particularly, the present subject matter relates to a system and method for generating a three-dimensional (3D) model on-demand in a product management system based on user input.

BACKGROUND OF THE INVENTION

Speed, simplicity and self-confidence are important elements in becoming and maintaining a competitive business. As competitiveness in a marketplace increases, quickly responding to specific demands within the market becomes increasingly important. If one competitor fails to quickly respond to a consumer's demand, then the consumer's demand may substantially decrease, at least with regard to products of the one competitor. The consumer may use a suitable substitute product from another competitor. Consumer demands are important not only upon initial product selection, but with continued product maintenance and upgrades over the life of a product.

Many factors contribute to slowing the process of bringing a product to market, thereby weakening the competitiveness of a business. Complexity of a product contributes to the difficulties in meeting specific consumer design demands in a timely manner. The complexity of world-wide production, the changing nature of competition, and even the complexity internal to production companies, generally slow the process of bringing a new or even modified product to market.

In order to coordinate and expedite product creation and management, product or materials management software applications have been created. For example, product lifecycle management (PLM) software applications have been developed as an information technology (IT) resource to provide a global environment for developing, describing, managing and communicating digital product knowledge and related information. Some PLM systems enable a company to design and render products virtually, thus avoiding the need to build prototypes. Such systems can save money, parts and other resources as well improve product and workplace safety and ergonomics.

Specific product information rendered by manufacturers has conventionally been coordinated by employing so-called "Bills of Materials" (BOMs). The term "bill-of-materials," as conventionally understood in the art, refers to an explosion listing of physical parts. Specifically, a product may have many subassemblies, some or all of which may have further subassemblies. A bill-of-materials is a printed-out parts list having indentations where the indentations correspond to a depth of hierarchy of each product in each subassembly. The bill-of-materials traditionally has been utilized during the manufacturing process of an assembly to provide a reference for the relationship of each physical component to other physical components in the assembly.

In conventional BOM systems, management of BOMs can be complicated by the needs of different contributors and consumers of the BOM information. A BOM typically originates in Engineering and provides a list of parts necessary to define a product. The structure of an "Engineering Bill of Material" is determined by a breakdown of systems or logical groupings of parts. In order for a BOM to be used for the purposes of downstream organizations involved in the procurement or assembly of the products, changes need to be made to the structure of the BOM to accommodate these purposes. These changes result in multiple BOM structures. Maintaining separate BOM structures with a manual translation is error prone, and does not facilitate an efficient change management process. The issue of having multiple BOM structures is further compounded when a BOM is used by service personnel to track the components of a physical instance of a product. One approach for addressing the error-prone BOM management process is described in U.S. Patent Application Publication Number 2013/0006408, which is herein incorporated by reference.

In many instances, it is advantageous to model the BOMs in a three-dimensional (3D) CAD assembly. Two-dimensional (2D) assembly drawings can then be created from the 3D assembly for the manufacturing of a product. For many products, however, 2D assembly drawings may include hundreds of drawings illustrating only static views, which do not necessarily reflect the build process of the site-specific product. In addition, valuable information can be lost when converting from the 3D model to the 2D assembly drawings. Further, conventional 3D CAD assemblies can be difficult to maintain because of the unpredictable permutation of the BOM throughout the lifecycle of a product caused by change management. To model every possible permutation of a BOM in a 3D CAD model, as well as providing manufacturing site-specific views of the 3D model, can be impossible to accomplish with reasonable effort.

Thus, a need exists for improved systems and methods for generating 3D assemblies from digitized data in a PLM system based on user input.

BRIEF DESCRIPTION OF THE INVENTION

Aspects and advantages of the invention will be set forth in part in the following description, or may be obvious from the description, or may be learned through practice of the invention.

In one aspect, the present disclosure is directed to a method for generating a three-dimensional (3D) assembly on-demand in a product lifecycle management (PLM) system. The method includes electronically creating and storing one or more instance objects in the PLM system. Another step includes electronically mapping the one or more instance objects to function information in the PLM system. Still a further step includes electronically receiving, via a network portal, user input regarding a selection of one or more functions representing product information from the PLM system. The method also includes electronically generating the 3D assembly based on one or more of the mapped instance objects and the user input. Thus, the 3D assembly can be generated based on any information related to the mapped instance objects and/or the function information. In addition, the 3D assembly can be enriched with any information related to the mapped instance objects or function information.

In one embodiment, the step of electronically creating or storing one or more instance objects in the PLM system may also include electronically extracting position information of one or more parts from a coordinate reference system in the PLM system and electronically extracting part model information for each of the one or more parts from the PLM system. In certain embodiments, the position information may include information regarding at least one of translation or rotation of the one or more parts. In addition, the part model information may include at least 3D geometry for each of the one or more parts.

In another embodiment, the method may also include separately storing, via a memory storage device, the extracted position information and the extracted part model information. In additional embodiments, the step of electronically extracting the position information of the part in the coordinate reference system in the PLM system and electronically extracting the part model information of the part may include extracting the position information and the part model information from a 3D CAD environment. In certain embodiments, the 3D CAD environment may include any one of or a combination of the following: unit BOM information, part number, system information, product information, technical features, commercial features, product descriptions, or similar.

In another embodiment, the method may also include identifying different stages throughout a lifecycle of the product configuration and controlling selected methods and data that can be applied to manage the 3D assembly at the different stages throughout the lifecycle of the product configuration. In addition, the method may include electronically providing a visual representation of the 3D assembly to a user. In still further embodiments, the 3D assembly may be enriched with at least the function information. The present disclosure is also directed to a non-transitory computer-readable medium including executable instructions configured to control a processor to implement the method as described herein.

In another aspect, the present disclosure is directed to a method for generating a visual representation on-demand based on data in a product management system. The method includes electronically creating and storing one or more instance objects in the product management system. Another step includes electronically mapping the one or more instance objects to function information in the product management system. The method also includes electronically receiving, via a network portal, user input regarding a selection of one or more functions representing product information from the product management system. Another step includes electronically generating and providing the visual representation on-demand to a user based on the one or more mapped instance objects and the user input. The method may also include any of the additional features and/or step described herein.

In still another aspect, the present disclosure is directed to a system for generating a system for generating a three-dimensional (3D) assembly on-demand in a product management system. The system includes a computer module communicatively configured with a network-based portal. The computer module is configured to perform one or more operations, including but not limited to electronically creating and storing one or more instance in the product management system, electronically mapping the one or more instance objects to function information in the product management system, electronically receiving, via the network portal, user input regarding a selection of one or more functions representing product information from the product management system, and electronically generating a 3D assembly based on one or more of the mapped instance objects and the user input. Thus, the system generates the 3D assembly based on any information related to the mapped instance objects and/or the function information. In addition, the system can enrich the 3D assembly with any information related to the mapped instance objects or function information.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a block diagram of a prior art bill-of materials (BOM) generation system;

FIG. 2 illustrates a block diagram of a prior art BOM structure;

FIG. 3 illustrates a block diagram of one embodiment of a product lifecycle management (PLM) system, including particular software modules within the PLM system and user interface features for accessing the PLM system according to the present disclosure;

FIG. 4 illustrates a block diagram of one embodiment of a portion of a PLM system according to the present disclosure particularly illustrating a 3D assembly module;

FIG. 5 illustrates a block diagram of a CAD BOM structure according to the present disclosure;

FIG. 6 illustrates a flow diagram of one embodiment of a method implemented by a 3D extraction module according to the present disclosure;

FIG. 7 illustrates a flow diagram of one embodiment of a method implemented by a 3D generation module according to the present disclosure;

FIG. 8 illustrates a schematic diagram of one embodiment of mapped function-related information to stored part model information and position information conducted by a mapping algorithm of a 3D extraction module according to the present disclosure;

FIG. 9 illustrates a schematic diagram of an example 3D assembly generated by a 3D generation module according to the present disclosure;

FIG. 10 illustrates another schematic diagram of example 3D assembly generated by a 3D generation module according to the present disclosure;

FIG. 11 illustrates a schematic diagram of a 3D CAD BOM structure and a corresponding 3D assembly generated by a 3D generation module from the configurable structure according to the present disclosure;

FIG. 12 illustrates another schematic diagram of a configurable structure and a corresponding 3D assembly generated by a 3D assembly module from the configurable structure according to the present disclosure; and FIG. 13 illustrates a schematic diagram of a 3D assembly according to the present disclosure.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

The presently disclosed technology generally concerns different features and aspects of a centralized product definition and management systems. Many examples herein describe such features in the context of a product lifecycle management (PLM) system, although it should be appreciated that selected features and steps disclosed herein may be more broadly applicable to any type of electronic system in which product definition and management features are employed.

Generally, the present disclosure is directed to a system and method for generating a 3D assembly on-demand from digitized data in a PLM system based on user input. More specifically, position and part model information are extracted from a 3D CAD environment such as a 3D CAD bill-of-materials (BOM) structure. In addition, a mapping algorithm creates instance objects from the extracted data and references the instance objects to a function in the PLM system. The algorithm may also calculate the final position of a part in the coordinate reference system of a product and save it in the instance objects together with reference to a part model. Thus, a user can select one or more functions representing product information from the PLM system and the system can electronically generate the 3D assembly based on the mapped instance objects and the user input. Accordingly, the content of the generated 3D assembly, the 3D view, as well its structure, is based on user selection. By taking function information from the PLM system, the algorithm is able to create 3D assemblies enriched with PLM information. In addition, by combining instance objects of several functions, it is possible to generate complex 3D representations of data in the PLM system.

The present disclosure has many advantages not present in the cited art. For example, the present disclosure is able to eliminate the need to create 2D assembly drawings from a 3D model, which is an expensive and time-consuming process. In addition, the 3D assemblies of the present disclosure are created quickly and on-demand. Further, the 3D assemblies are enriched with information from the PLM system, therefore, among other capabilities, the assemblies are able to reflect a site-specific build process or service specific requirements. Thus, the 3D assemblies of the present disclosure are more valuable, precise, and easier to handle for end users than conventional 2D drawings. More specifically, the 3D assembly can be generated based on any information related to the mapped instance objects and/or the function information. In addition, the 3D assembly can be enriched with any information related to the mapped instance objects or function information.

Referring now to the drawings, FIGS. 1, 2 and 5 illustrate various aspects of prior art technology for use in product and parameter management features. More specifically, FIG. 1 illustrates a high level block diagram of a prior art bill-of-material generation system 100, whereas FIG. 2 illustrates a block diagram of a prior art BOM structure 200. In the prior art system of FIG. 1, a user supplies design specifications to a bill-of-material generation system 100. Output from the present bill-of-material generation system includes an indented list of parts, i.e. a bill-of-material structure as shown in FIG. 2. A primary advantage of the prior art bill-of-material generation system 100 is the automatic generation of a bill-of-material from design specifications alone, and automatic configuration of product assemblies.

Such systems generally utilize assembly model tables and selection criteria tables that include rules and assembly data to automatically generate the bill-of-material. The bill-of-material generation system 100 of FIG. 1 provides several advantages, but leaves room for needed improvements as addressed by the disclosed technology. In particular, such systems can generate a BOM structure (FIG. 2) from a CAD BOM (FIG. 5). It is also possible to extract 3D information from the CAD BOM 200 and have a lightweight 3D representation of the BOM for downstream organizations without the need to access CAD systems. Such systems assume that the structure and components of the CAD BOM are predefined in CAD. This assumption, however, requires that every possible permutation of a BOM be modeled in CAD first. Organization-dependent views of the BOM must also be modeled in CAD or with strict translation rules and loss of flexibility. Such a requirement contradicts with business needs on speed and effectiveness. To address this issue, the present disclosure extracts and calculates total position matrices and part models from a 3D CAD environment and maps the extracted information to a function. Thus, all possible combinations of functions can be used to create a 3D assembly on-demand at a later time when requested by a user. In addition, the present disclosure incorporates function-related information from the PLM system to enrich the 3D assembly with valuable data. Moreover, the function-related information can be used to define the indented BOM structure or the created 3D assembly. Accordingly, functions and related information, as well as a desired structure, can be chosen by a user and allow for maximum flexibility without the need to return to the CAD BOM 200.

Although features associated with the 3D assembly may be implemented in separate and distinct embodiments, some non-limiting embodiments of the invention combine the 3D assembly in the context of a single comprehensive software application referred to herein as a product lifecycle management (PLM) system 300 as depicted in FIG. 3. The specific component of PLM system 300 that addresses 3D assembly generation are represented as a specific software module within PLM 300, namely the 3D assembly module 303. Other non-limiting examples of modular portions within the PLM system 300 include a bill-of-materials (BOM) module 302, a controls module 304, an engineering module 306 and a product module 308. The operation of engineering and product modules 306 and 308 or other conventional software features of a PLM system are known and understood by those of ordinary skill in the art.

Still referring to FIG. 3, the PLM system 300 is a software-based module having a set of computer-readable and executable instructions that are stored on a tangible computer-readable medium such as represented by memory/media device 301. The memory/media device 301 may include the software instructions configured to implement the program features and steps of PLM system 300 and/or product data and other information that is accessed by the software instructions. Memory/media device 301 may be provided as single or multiple portions of one or more varieties of tangible, non-transitory computer-readable media, such as but not limited to any combination of volatile memory (e.g., random access memory (RAM, such as DRAM, SRAM, etc.) and nonvolatile memory (e.g., ROM, flash, hard drives, magnetic tapes, CD-ROM, DVD-ROM, etc.) or any other memory devices including diskettes, drives, other magnetic-based storage media, optical storage media, solid state storage media and others. When software is used, any suitable programming, scripting, or other type of language or combinations of languages may be used to implement the teachings contained herein. It should be appreciated that other embodiments of the present technology may implement the presently disclosed features in alternative ways, such as by hard-wired logic or other circuitry, including, but not limited to application-specific circuits.

The PLM system 300 may be stored in a variety of computer-accessible media locations, for example on one or more dedicated servers or combinations of networked computers or networked storage devices. In some embodiments, the storage location of PLM system 300 is accessible from other computers via network 310. In some embodiments, other computers (not shown) connected to the network 310 locally store a copy of PLM system 300, but selected data accessed by such application is stored in a central or distributed network-accessible location.

When access to the software features of PLM system 300 is obtained remotely, such remote connection may be established directly or indirectly via one or more wired or wireless connections to the memory/media device 301 hosting the PLM system 300. Remote computers may be coupled via network 310, which may correspond to any type of network, including but not limited to a dial-in network, a utility network, public switched telephone network (PSTN), a local area network (LAN), wide area network (WAN), local area network (LAN), wide area network (WAN), metropolitan area network (MAN), personal area network (PAN), virtual private network (VPN), campus area network (CAN), storage area network (SAN), the Internet, intranet or Ethernet type networks, combinations of two or more of these types of networks or others, implemented with any variety of network topologies in a combination of one or more wired and/or wireless communication links.

Computers that access the subject PLM system 300 or selected features thereof may respectively include one or more communication interfaces, one or more memory/media devices, and one or more processing devices such as a microprocessor or the like. Such computing/processing device(s) thus may be adapted to operate as a special-purpose machine by executing the software instructions rendered as part of PLM system 300. The software instructions stored in memory/media device 301 may also define a plurality of different interfaces for accessing the PLM system 300, thus interfacing the PLM system 300 for different corporate entities associated with product management. For example, FIG. 3 illustrates exemplary software interfaces in the form of new product introduction (NPI) interface 312, requisition application interface 314, commission implementation interface 316 and operational feedback interface 318. In this way, different types of access to PLM system 300 can be customized for different corporate entities based on different needs of a product lifecycle (e.g., product creation, requisition, implementation and operation).

System users may be provided with access to the PLM system 300 and/or selected software features thereof via one or more user I/O control devices 320 as also shown in FIG. 3. Exemplary input device(s) may include but are not limited to a keyboard, touch-screen monitor, eye tracker, microphone, mouse and the like. Exemplary output devices may include but are not limited to monitors, printers or other devices for visually depicting output data created in accordance with the disclosed technology. Other I/O devices correspond to intermediate computer components such as memories or processors accessing PLM system 300. The term "user" as used herein refers to a human operator, another computer, or a combination human-computer operator. It should be understood, therefore, that the term "user" is not limited to meaning a human operator.

Additional communication with PLM system 300 or selected modular features thereof may be provided to an actual product or unit that is being managed in accordance with the PLM software. Communication with PLM system 300 may also occur with a network 310 such as represented in FIG. 3. In many instances, the product or unit 330 is interfaced to the network 310 via a controller 332. Controller 332 may include a computerized control system electrically linked to each component or part of the product/unit 330 and capable of controlling any mechanisms that control operation of each part or component.

The particular types of products that may be managed in accordance with the disclosed technology may correspond to a variety of different types of products, assemblies, processes or even computer software. In some particular examples, the disclosed technology may be used with a PLM application for managing power generation and related energy components, such as but not limited to wind turbine generators (WTGs), gas turbines, steam turbines, solar power assemblies and the like.

Referring now to FIG. 4, a portion of the PLM system 300 of FIG. 4 particularly illustrating the 3D assembly module 303 according to the present disclosure is illustrated. As shown in the illustrated embodiment, the 3D assembly module 303 may include a 3D extraction module 305 and a 3D generation module 307. Thus, the 3D assembly module 303 is configured to generate a 3D assembly 350 on-demand based on user input from digitized data in the PLM system 300 via 3D assembly interface 315. In particular, as shown in FIG. 13, the 3D assembly 350 may include the 3D assembly view 352 and the configurable structure 348, which will be discussed in more detail below.

In addition, as shown particularly in FIGS. 4 and 6, the 3D extraction module 305 is configured to extract data (e.g. position information of one or more parts in a coordinate reference system and the part model information for each of the one or more parts) from the 3D CAD environment of the engineering module 306 (step 502). In certain embodiments, the data may be manually extracted by a user. In alternative embodiments, the data may be extracted using a computer algorithm. Thus, the 3D extraction module 305 is configured to extract all relative transform matrices used to position the part model from the CAD environment (step 504) and part model (i.e. lightweight format) from the CAD environment (step 506). Further, the 3D extraction module 305 is configured to electronically calculate the total transformation of one or more parts based on the extracted information so as to create one or more instance objects (step 508). Thus, the instance objects are related to functions for future usage in on-demand 3D assemblies (step 510). In additional embodiments, the functions can be assigned in the CAD environment before extracting the position and part model information.

As used herein, the "position information" may contain the complete or total transformation of a part in the coordinate reference system of a product. More specifically, the position information may include information regarding at least one of translation or rotation of the part stored in a matrix as shown in FIG. 6. In a conventional 3D CAD environment, as shown in FIG. 2, assemblies are created and stored in a tree structure including models, assemblies, and/or subassemblies. Thus, as shown in FIG. 2, there is positioning information stored for each child (e.g. PM1, PM1, PM2) relative to its parent (e.g. TopAssembly or SubAssembly), which is typically stored as a matrix. In addition, the 3D assembly module 303 calculates a single matrix which describes the total transformation of a model relative to its top or parent assembly by using matrix multiplication and combining all child matrices. Thus, if TopAssembly is also the root of a product master model, then the total transformation of the model describes how a part is positioned in a product coordinate reference system without the need to take subassemblies into account.

In addition, the "part model information" as described herein may include, at least, the 3D geometry of each of the parts. Further, the part model information may include a full-scale part model, a "lightweight" part model, or any model therebetween. A full-scale model contains all relevant information that is needed for given applications, but may contain more information than practically needed, thereby occupying superfluous storage space in the memory/media device 301. As a result, a full-scale model may require a user to purchase expensive 3D software and the handling speed can be inevitable slow. In contrast, a lightweight model may contain a reduced version of the full-scale model (e.g. a shell model) with intelligent information contained therein, but may require only a 3D viewer rather than an entire 3D software package. In addition, for certain embodiments, the lightweight models may be stored only once in the PLM system 300 and can be reused for different functions and different parts (e.g. if there is no geometric difference).

Referring to FIGS. 4 and 8, the position information 336 and part model information 338 may be separately stored in an instance object 342 which is related to a function 344 that can be accessed at any time by the 3D assembly module 303 to create a 3D assembly 350 on-demand according to the present disclosure. Thus, it should be understood that the instance object(s) 342 may contain or reference part model information 338 (e.g. a lightweight model) and position information 336 (e.g. a calculated total position matrix). The 3D extraction module 303 utilizes a mapping algorithm (which can be manually triggered or automated) to electronically map the one or more instance objects 342 to a function 344 of the PLM system 300. More specifically, as shown particularly in FIG. 8, the position information 336 (e.g. the final position of a part in the coordinate reference system of a product) and the part model information 338 may be mapped to the function 344 and saved within one or more instance objects 342 (e.g., $I_1$, $I_2$, or $I_3$).

Referring to FIGS. 4 and 7, during generation of the 3D assembly by the 3D generation module 307, the 3D generation module 307 may utilize data from the technical product hierarchy data structure 346 and function-related information 340 of the BOM module 302 to generate the 3D assembly 350. The technical product hierarchy data structure 346 generally defines the engineering structure information for a product as a collection of functions (descriptive components) in a logical hierarchy. The classification hierarchy within the technical product hierarchy data structure 346 ultimately classifies all possible parts for a product. Still further, the classification breaks a product down to unique functions 344 within the product. Functions generally correspond to a particular component within a product, and may correspond to either a single part, i.e., a "piece part," or an inseparable assembly of multiple parts. Each function 344 has a unique usage and it is possible that multiple parts can satisfy the same function. Functions are typically defined to be unique for each system, yet another possible category within the technical product hierarchy data structure 346. Thus, the 3D assembly view 352, as well as its structure 348, can be based on user-selected function 344 and function-related information 340 in the PLM system 300, such as a unit BOM, a filter set in a technical product hierarchy 346, unit changes, engineering changes, and/or similar.

In addition, the function-related information 340 may be directly specified by a user via the user control device 320 or may be determined based on additional information supplied by a user via the user control device 320 (FIG. 3). For example, in one embodiment, the 3D generation module 307 receives user input regarding a selection of one or more functions representing one or more product configurations (step 602). The 3D generation module 307 may also receive user input regarding a desired 3D assembly structure (i.e. using function-related information 340) (step 604). In certain embodiments, the function-related information 340 can be determined based on one or more operations specified by a user The 3D assembly module 303 can then use the instance objects related to the user-selected function(s) to compose the 3D assembly 350 (step 606) such that the structure of the 3D assembly 350 is created based on user input and the function-related information 344. A visual representation of the 3D assembly can then be provided to a user (step 610).

One example of the present disclosure is illustrated in the embodiment of FIG. 8. As shown, function F1 requires two P1 parts, whereas function F2 requires one P2 part. Thus, if a user specifies function F1 as a desired function, then the 3D assembly module 303 is configured to take two instance objects using part model PM1 with their corresponding position information 336 to include in the generated 3D assembly 350. Similarly, if a user specifies function F2 as a desired function, then the 3D assembly module 303 is configured to take one instance object using part model PM2 with its corresponding position information 336 to include in the generated 3D assembly 350. It should be understood that the function-related information 340 and corresponding parts illustrated in FIG. 6 are provided for example only and are not meant to be limiting.

Accordingly, by taking function-related data from the PLM system 300, the algorithm of the 3D assembly module 303 is able to create 3D assemblies (geometry collections) enriched with PLM information. For example, as shown in FIGS. 9 and 10, the user can specify two different functions of a desired product configuration, namely F1 and F2. Based on the specified functions, the 3D assembly module 303 generates a 3D assembly with two PMI part models 354 and orients them in the proper location (FIG. 9) to represent P1 which is used on function F1. In another example, the 3D assembly module 303 generates a 3D assembly with one PM2 part model 352 to represent function F2 and two PMI part models 354 to represent P2. The resulting 3D assembly illustrates F1 and F2 correctly positioned relative to each other (FIG. 10) based on the mapping information (FIG. 8). Thus, the 3D assembly 350 includes position information 336, part model information 338, and function-related information 340. Accordingly, the algorithm of the 3D assembly module 303 is configured to create any assembly structure (i.e. geometry collection) using function-related data from the PLM system 300. By combining instance objects of several functions, it is possible to generate complex 3D assemblies of data in the PLM system 300 on-demand. In further embodiments, the 3D assembly module 303 may also be configured to identify different stages throughout a lifecycle of the product and control selected methods and data that can be applied to manage the 3D assembly 350 at the different stages throughout the lifecycle of the product.

Referring now to FIGS. 11 and 12, the system and method of the present disclosure may also be configured to electronically create a 3D assembly 352 from function-related information. As one example the configurable structure 348 can be based on manufacturing site-specific data (as indicated by the data in the "Operation" column). In various embodiments, the site-specific operational data may include one or more of the following: unit BOM information, part number, system information, product information, technical features, commercial features, product descriptions, or any other PLM system information. Thus, rather than using the 3D CAD environment to extract position and part model information as mentioned above, the 3D assembly 350 can be generated from function-related information. The resulting 3D assembly 350 includes an assembly structure 348 and 3D assembly view 352 (FIG. 12). For example, as shown in FIG. 11, a user can input certain site-specific operational data that corresponds to one or more functions. Each function corresponds to certain parts and quantities. Thus, the system 300 can generate the 3D assembly 350 based on the function and operational data that exists as function-related information. In such embodiments, the configurable structure 348 based on user input may be different for multiple users, but the 3D view of the assembly 350 may generate the same result.

The present disclosure is also directed to a non-transitory computer-readable medium including executable instructions configured to control a processor to implement the method as described herein. Further, although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for generating a three-dimensional (3D) assembly on-demand in a product lifecycle management (PLM) system, the method comprising: electronically creating and storing a plurality of instance objects in the PLM system based on total positioning information calculated from extracted data from a computer-aided-design (CAD) environment; electronically mapping the plurality of instance objects to corresponding function information in the PLM system; electronically receiving, via a network portal, user input regarding a selection of one or more functions representing product information from the PLM system; and, subsequently electronically generating the 3D assembly on-demand based on the mapped instance objects to the function information and the user regarding the selection of the one or more functions, wherein the 3D assembly includes the function information in the PLM system such that a user can access the function information directly via the 3D assembly.

2. The method of claim 1, wherein electronically creating and storing the plurality of instance objects in the PLM system based on the total positioning information calculated from the extracted data from the CAD environment further comprises:
electronically extracting position information of one or more parts from a coordinate reference system of a product in the PLM system from the CAD environment; and,
electronically extracting part model information for each of the one or more parts in the PLM system from the CAD environment.

3. The method of claim 2, wherein the position information comprises at least one of translation or rotation of the one or more parts.

4. The method of claim 2, wherein the part model information comprises at least 3D geometry for each of the one or more parts.

5. The method of claim 2, further comprising separately storing, via a memory storage device, the extracted position information and the extracted part model information in the instance objects.

6. The method of claim 2, wherein the CAD environment comprises a 3D CAD environment.

7. The method of claim 1, wherein the PLM system further comprises one or more of the following: unit BOM information, part number, system information, product information, technical features, commercial features, or product descriptions.

8. The method of claim 1, further comprising identifying different stages throughout a lifecycle of the product configuration and controlling selected methods and data that can be applied to manage the 3D assembly at the different stages throughout the lifecycle of the product configuration.

9. The method of claim 1, further comprising electronically providing a visual representation of the 3D assembly to a user.

10. A non-transitory computer-readable medium comprising executable instructions configured to control a processor to implement a method as set forth in claim 1.

11. A method for generating a visual representation on-demand in a product management system, the method comprising: electronically creating and storing a plurality of instance objects in the product management system based on total positioning information calculated from extracted data from a computer-aided-design (CAD) environment; electronically mapping the plurality of instance objects to corresponding function information in the product management system; electronically receiving, via a network portal, user input regarding a selection of one or more functions representing product information from the product management system; and, subsequently generating and providing the visual representation on-demand to a user based on the mapped instance objects to the function information and the user input regarding the selection of the one or more functions, wherein the visual representation includes the function information in the product management system such that a user can access the function information directly via the 3D assembly.

12. The method of claim 11, wherein the PLM system comprises one or more of the following: unit BOM information, part number, system information, product information, technical features, commercial features, or product descriptions.

13. The method of claim 11, further comprising identifying different stages throughout a lifecycle of the product configuration and controlling selected methods and data that can be applied to manage the visual representation at the different stages throughout the lifecycle of the product configuration.

14. The method of claim 11, further comprising electronically providing a visual representation of the 3D assembly to a user.

15. A non-transitory computer-readable medium comprising executable instructions configured to control a processor to implement a method as set forth in claim 11.

16. A system for generating a three-dimensional (3D) assembly on-demand in a product management system, the system comprising: a computer module communicatively configured with a network-based portal, the computer module configured to perform one or more operations, the operations comprising: electronically creating and storing a plurality of instance objects in the product management system based on total positioning information calculated from extracted data from a computer-aided-design (CAD) environment, electronically mapping the plurality of instance objects to corresponding function information in the product management system, electronically receiving, via the network portal, user input regarding a selection of one or more functions representing product information from the product management system, and subsequently generating a 3D assembly on-demand based on the mapped instance objects to the function information and the user input regarding the selection of the one or more functions, wherein the 3D assembly includes the function information in the product management system such that a user can access the function information directly via the 3D assembly.

* * * * *